United States Patent
Nah et al.

(10) Patent No.: US 9,875,985 B2
(45) Date of Patent: Jan. 23, 2018

(54) FLIP-CHIP BONDER WITH INDUCTION COILS AND A HEATING ELEMENT

(71) Applicant: International Business Machines Corporation, Armonk, NY (US)

(72) Inventors: Jae-woong Nah, Closter, NJ (US); Sébastien S. Quesnel, Granby (CA); Katsuyuki Sakuma, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 570 days.

(21) Appl. No.: 14/543,950

(22) Filed: Nov. 18, 2014

(65) Prior Publication Data
US 2016/0141264 A1 May 19, 2016

(51) Int. Cl.
*H01L 23/00* (2006.01)
*B23K 1/002* (2006.01)
(Continued)

(52) U.S. Cl.
CPC .............. *H01L 24/81* (2013.01); *B23K 1/002* (2013.01); *B23K 1/0016* (2013.01); *B23K 1/012* (2013.01); *H01L 24/75* (2013.01); *H01L 25/0657* (2013.01); *H05B 6/06* (2013.01); *H05B 6/105* (2013.01); *H05K 3/3494* (2013.01); *B23K 2201/42* (2013.01); *H01L 23/49816* (2013.01); *H01L 24/13* (2013.01); *H01L 24/16* (2013.01); *H01L 24/17* (2013.01); *H01L 24/32* (2013.01); *H01L 24/73* (2013.01);
(Continued)

(58) Field of Classification Search
CPC ..... H01L 2924/00012; H01L 2224/131; H01L 2224/81203; H01L 2224/81815; H01L 2924/15738; H01L 2924/01014; H01L 2924/014; H01L 2224/16145; H01L 2224/16227; H01L 2224/1703; H01L 2224/17181; B29C 66/71; B29C 66/8122; B29C 65/00; B29C 66/534; B29C 66/81811; B29C 33/06; B29C 43/02; B29C 43/52; B29C 45/73; B29C 53/04; B29C 59/002; B29C 65/18; B29C 65/32; B29C 65/46; B29C 65/481; B23K 1/002
USPC ................................. 228/227, 230; 219/601
See application file for complete search history.

(56) References Cited

U.S. PATENT DOCUMENTS 3,384,958 A * 5/1968 Christian ............. B23K 1/0004
219/58
3,704,357 A * 11/1972 Moulin .................. B23K 1/002
219/615
(Continued)

FOREIGN PATENT DOCUMENTS

KR 1020130088441 A 8/2013

OTHER PUBLICATIONS

YouTube video, "Induction Heating—Quick Demonstration", http://www.youtube.com/watch?v=7ipZ4vdivbU&feature=plcp &context=C35fe495UDOEgsToPDskICWBpylV5XUS6Y11WAdKWR, uploaded on Jun. 18, 2011, accessed on Nov. 12, 2014, Innovative Induction Heating.

(Continued)

*Primary Examiner* — Erin Saad
*Assistant Examiner* — Carlos Gamino
(74) *Attorney, Agent, or Firm* — Erik K. Johnson

(57) ABSTRACT

A method and apparatus for flip chip bonding using conductive and inductive heating to heat a plurality of solder bumps located between a chip carrier and a chip.

16 Claims, 4 Drawing Sheets

(51) Int. Cl.

| | | |
|---|---|---|
| *H05B 6/06* | (2006.01) |
| *H05B 6/10* | (2006.01) |
| *B23K 1/00* | (2006.01) |
| *B23K 1/012* | (2006.01) |
| *H01L 25/065* | (2006.01) |
| *H05K 3/34* | (2006.01) |
| *B23K 101/42* | (2006.01) |
| *H01L 23/498* | (2006.01) |
| *H01L 25/00* | (2006.01) |

(52) U.S. Cl.
CPC ...... *H01L 25/0652* (2013.01); *H01L 25/0655* (2013.01); *H01L 25/50* (2013.01); *H01L 2224/131* (2013.01); *H01L 2224/16145* (2013.01); *H01L 2224/16227* (2013.01); *H01L 2224/1703* (2013.01); *H01L 2224/17181* (2013.01); *H01L 2224/32225* (2013.01); *H01L 2224/73204* (2013.01); *H01L 2224/75251* (2013.01); *H01L 2224/75252* (2013.01); *H01L 2224/75266* (2013.01); *H01L 2224/75744* (2013.01); *H01L 2224/75745* (2013.01); *H01L 2224/81203* (2013.01); *H01L 2224/81222* (2013.01); *H01L 2224/81815* (2013.01); *H01L 2225/06513* (2013.01); *H01L 2225/06517* (2013.01); *H01L 2225/06572* (2013.01); *H01L 2924/14* (2013.01); *H01L 2924/157* (2013.01); *H01L 2924/1579* (2013.01); *H01L 2924/15311* (2013.01); *H01L 2924/15738* (2013.01); *H01L 2924/15788* (2013.01); *H01L 2924/3511* (2013.01); *H05K 2201/10674* (2013.01)

(56) References Cited

U.S. PATENT DOCUMENTS

| | | | | |
|---|---|---|---|---|
| 4,487,313 A | * | 12/1984 | Repik | B26F 3/06 206/204 |
| 4,822,971 A | * | 4/1989 | Peterson | B23K 3/063 219/610 |
| 5,216,807 A | * | 6/1993 | Yoshizawa | H01L 21/486 174/262 |
| 5,520,323 A | * | 5/1996 | Hauner | B23K 1/002 200/268 |
| 6,229,124 B1 | * | 5/2001 | Trucco | B23K 1/002 219/605 |
| 6,288,376 B1 | | 9/2001 | Tsumura | |
| 6,991,967 B2 | | 1/2006 | Liu et al. | |
| 7,064,004 B2 | | 6/2006 | Frutschy | |
| 7,161,122 B2 | | 1/2007 | DeBonis | |
| 7,452,800 B2 | | 11/2008 | Sosnowchik et al. | |
| 7,902,060 B2 | * | 3/2011 | Swaminathan | H01L 24/81 438/612 |
| 8,324,522 B2 | | 12/2012 | Kim et al. | |
| 8,381,966 B2 | | 2/2013 | Kumar et al. | |
| 8,420,989 B2 | | 4/2013 | Kim et al. | |
| 8,987,130 B2 | * | 3/2015 | Fritz | H01L 24/75 438/612 |
| 9,508,680 B1 | * | 11/2016 | Ayotte | H01L 24/98 |
| 9,647,189 B2 | * | 5/2017 | Tischler | H01L 33/62 |
| 2008/0128896 A1 | * | 6/2008 | Toh | H01L 23/473 257/712 |
| 2008/0268571 A1 | | 10/2008 | Kim | |
| 2009/0134204 A1 | * | 5/2009 | Kimbara | B23K 1/0016 228/179.1 |
| 2011/0210283 A1 | * | 9/2011 | Ramirez | B23K 35/025 252/62.55 |
| 2013/0127041 A1 | * | 5/2013 | Goh | B23K 1/0016 257/737 |
| 2013/0320523 A1 | * | 12/2013 | Lee | H01L 24/75 257/737 |
| 2014/0256090 A1 | | 9/2014 | Interrante et al. | |
| 2015/0089805 A1 | * | 4/2015 | Ayotte | B23K 1/0016 29/840 |

OTHER PUBLICATIONS

IBM et al., "Solder Decal Design for Induction Heating Reflow", IBM Technical Disclosure Bulletin, vol. 37, No. 08, Aug. 1, 1994, ip.com No. IPCOM000113458D, 3 pages.

* cited by examiner

FLIP-CHIP BONDER WITH INDUCTION COILS AND A HEATING ELEMENT

BACKGROUND

The present invention generally relates to a flip chip assembly apparatus employing induction coils, and more particularly to selective area heating during flip chip assembly.

New integrated circuit technologies include three-dimensional integrated circuits. One type of 3D integrated circuit may include two or more layers of active electronic components stacked vertically and electrically joined with through-substrate vias and solder bumps. The 3D integrated circuit may provide numerous benefits such as increased package density yielding a smaller footprint, and improved bandwidth due to the short connection lengths made possible by the use of through-silicon-vias. The 3D integrated circuit described above may be fabricated in any number of known methods. Some 3D integrated circuits may include a silicon interposer which may be used to re-direct circuitry between a ship carrier and one or more top chips.

Warping or uneven heating of the components of the 3D integrated circuit during typical assembly may result in failed solder bump connections and short circuits. For example, non-wetting and bridging may be a result of warping or uneven heating. The influence warping and uneven heating has on 3D chip packaging may become more significant as the chip size increases and the component thickness decreases.

There are two primary methods for wetting solder bump connections: belt reflow furnaces and flip-chip bonders. A belt reflow furnace works by conveying one or more chips through one or more constant temperature ovens, in order to gradually increase the temperature to the point where the solder material can form a connection. Flip-chip bonders bond only a single chip at a time by quickly ramping up the temperature of the solder material to form connections.

BRIEF SUMMARY

An embodiment of the invention may include a method of forming a flip chip assembly. The method may include joining a chip to a chip carrier with a plurality of solder bumps. Joining the chip to the chip carrier may include heating the solder bumps to a temperature greater than the reflow temperature of the plurality of solder bumps using conductive heating and inductive heating.

Another embodiment of the invention may include a method of forming a flip chip assembly. The method may include joining a chip layer, where the chip layer includes at least a first chip and a second chip, to a chip carrier with a plurality of solder bumps. Joining the chip to the chip carrier includes heating the solder bumps to a temperature greater than the reflow temperature of the plurality of solder bumps using conductive heating and inductive heating.

Another embodiment of the invention may include a flip chip bonding apparatus. The flip chip bonding apparatus may contain a tool base having a first surface and a tool head having a second surface. The first surface of the tool base and the second surface of the tool head may facing each other, and the tool head may be moved with respect to the tool base. The flip chip bonding apparatus may contain a conductive heating element located in the tool head or the tool base. The flip chip bonding apparatus may contain an inductive heating element.

BRIEF DESCRIPTION OF THE SEVERAL DRAWINGS

The drawings are not necessarily to scale. The drawings are merely schematic representations, not intended to portray specific parameters of the invention. The drawings are intended to depict only typical embodiments of the invention. In the drawings, like numbering represents like elements.

Figure 1:
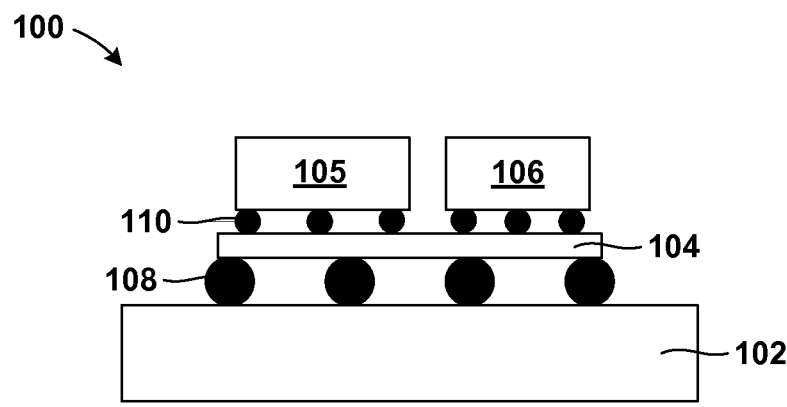
FIG. 1 illustrates a 3D integrated circuit package.

Elements of the figures are not necessarily to scale and are not intended to portray specific parameters of the invention. For clarity and ease of illustration, dimensions of elements may be exaggerated. The detailed description should be consulted for accurate dimensions. The drawings are intended to depict only typical embodiments of the invention, and therefore should not be considered as limiting the scope of the invention. In the drawings, like numbering represents like elements.

DETAILED DESCRIPTION

Exemplary embodiments now will be described more fully herein with reference to the accompanying drawings, in which exemplary embodiments are shown. This disclosure may, however, be embodied in many different forms and should not be construed as limited to the exemplary embodiments set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

The present invention generally relates to flip chip assemblies, and more particularly to selectively controlling the heating of one or more regions of a chip during a flip chip assembly process. The flip chip assembly process may include multiple steps in which heating may be controlled to yield specific assembly results.

By way of example, FIG. 1 illustrates a structure 100 representing a 3D integrated circuit (hereinafter "3D package"). The 3D package may include a chip carrier 102, an interposer 104, and at least one chip, such as a first top chip 105 and a second top chip 106. The interposer 104 may be joined on top of the chip carrier 102 via a plurality of solder bumps 108, while the first top chip 105 and the second top chip 106 may be joined on top of the interposer 104 via a second plurality of solder bumps 110. The first and second plurality of solder bumps 108, 110 may generally form connections to metalized pads (not shown) integrated into the surfaces of the chip carrier 102, the interposer 104, and the first top chip 105 and the second top chip 106. The chip carrier 102 may include a silicon substrate, a glass substrate or a laminated composite. Some 3D packages may include multiple chips stacked vertically on the chip carrier with or without an interposer.

The interposer 104 may simply include an electrical interface which may provide connectivity between the chip carrier 102 and the first top chip 105 and the second top chip 106. The interposer 104 may be used to spread one connection array to a wider pitch or reroute a particular connection to a different location. Like the first top chip 105 and the second top chip 106, the interposer 104 may include semiconductor devices, such as, for example, a passive device and a field affect transistor. The first top chip 105 and the second top chip 106 may include multiple semiconductor devices joined by multiple metallization layers. The chip carrier 102, the interposer 104, the first top chip 105 and the second top chip 106, all of the structure 100, may generally and collectively be referred to as components of a 3D assembly process (hereinafter "3D assembly").

The 3D assembly may include physically stacking one or more components described above and applying a temperature and a pressure to cause the solder bumps to reflow and form an electromechanical connection between the components. A thermal compression tool, such as a flip-chip bonder, may be used to apply the temperature and the pressure, and form the solder bump connections, for example, the first and second plurality of solder bumps 108, 110. A temperature in excess of the reflow temperature of the solder may be used to form the requisite electromechanical connection. The reflow temperatures of common lead-free solder bumps may range from about 230° C. to about 260° C., and the temperatures used in the thermal compression tool may range from about 230° C. to about 400° C. The applied temperatures of the thermal compression tool may depend on the interconnect material and chip size. A pressure ranging from about $6.0 \times 10^4$ Pa to about $6.0 \times 10^5$ Pa may be applied during the 3D assembly using the thermal compression tool, although this pressure may be adjusted based on the contact area and materials to be interconnected. In one embodiment, a force ranging from about 5 N to about 50 N may be applied. The force too may be adjusted based on the contact area and materials to be interconnected. In some cases, there may be between 20,000 and 170,000 solder bump connections between components, for example between the interposer 104 and the first top chip 105 and the second top chip 106.

Figure 2:
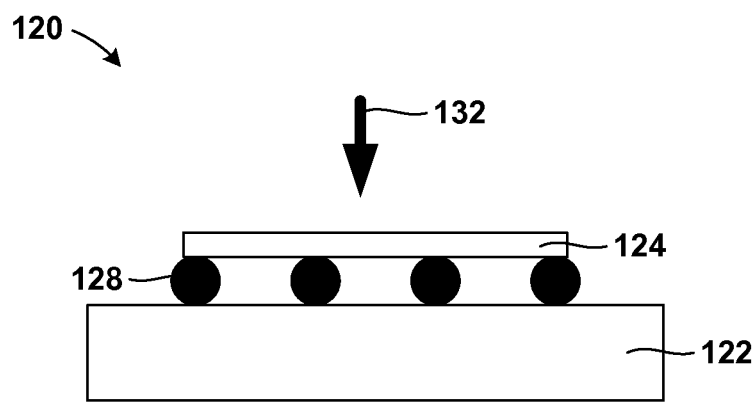
FIG. 2 illustrates an intermediate step in a flip chip assembly process.
Figure 3:
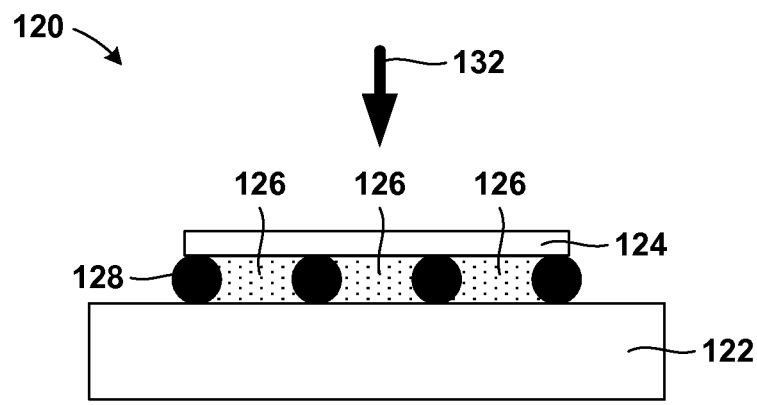
FIG. 3 illustrates an intermediate step in a flip chip assembly process with pre-applied underfill.

Now referring to FIG. 2, a step in the flip chip assembly of the structure 120 is shown. In this step, heat and a vertical pressure 132, as described above, may be applied to structure 120. This may allow for the solder bumps 128 to reflow to form a solid connection between the chip 124 and the substrate 122. In another example embodiment, illustrated in FIG. 3, an organic polymer 126 may be located between the solder bumps 128, which may eliminate the need to add underfill material in subsequent steps by curing during the reflow of the of the solder bumps 128.

Figure 4:
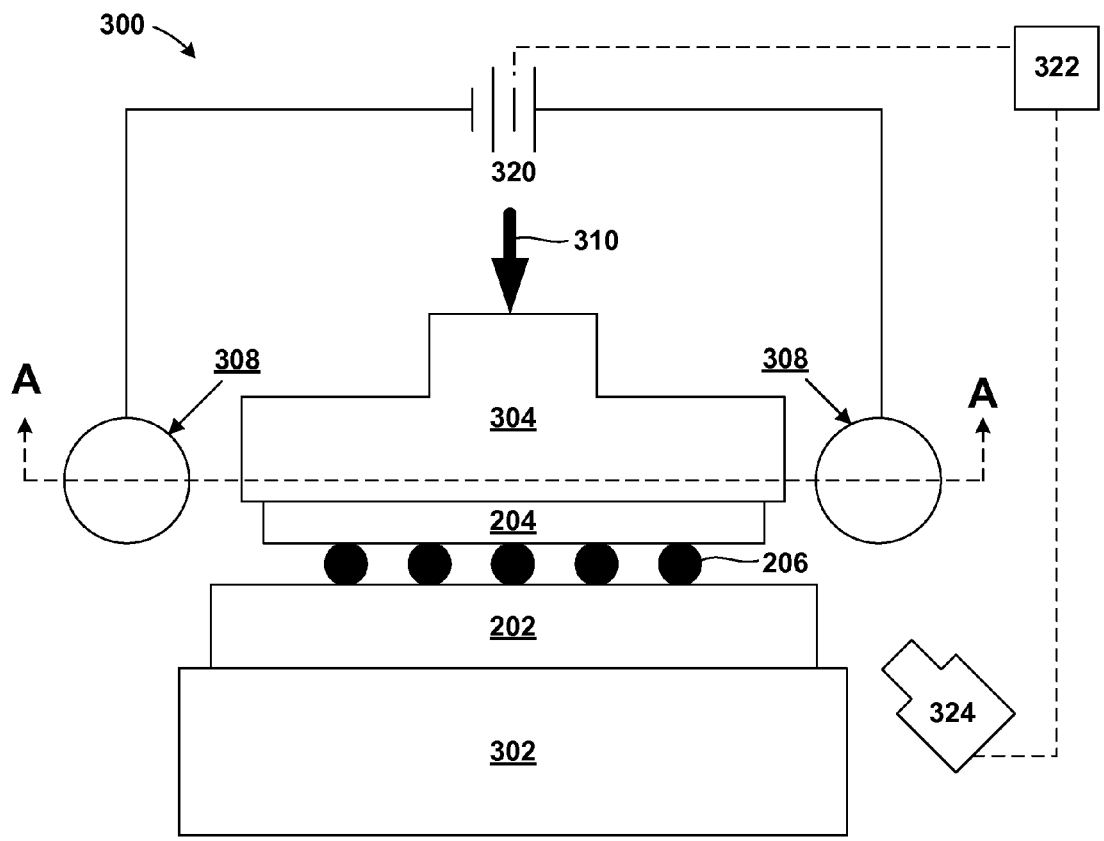
FIG. 4 illustrates a thermal compression tool used in the flip chip assembly process according to an exemplary embodiment.

Referring now to FIG. 4, a thermal compression tool 300 may be used to join the chip 204 to the chip carrier 202 using a plurality of solder bumps 206. The chip carrier 202 may include a silicon substrate, a glass substrate, an organic substrate, or some combination thereof. The thermal compression tool 300 may generally include a tool base 302 and a tool head 304. The tool base 302 and the tool head 304 may include a vacuum bias base stage with heating capabilities. The vacuum may be used to secure the components and hold them flat during a bonding sequence. Additionally, an induction coil 308 may be located on an anterior portion of the head, or located adjacent to the head. The induction coil 308 may be powered with a power source 320. The power source 320 may receive input from temperature controller 322 to change the frequency or intensity of induction which may change the inductive heating performed. The temperature controller 322 may receive temperature reading of an outer portion of the interposer from a temperature sensor 324, which may be a thermocouple or infrared temperature sensor. The chip 204 with the plurality of solder bumps 206 may be stacked on top of the chip carrier 202 using a pneumatic pick-and-place system, and then placed between the tool base 302 and the tool head 304. A heat profile and a uniform vertical pressure 310 may be applied to the stack, which may cause the chip 204 to be joined to the chip carrier 202. Preferably, the heat profile may be implemented in the tool head 304 and applied directly to the top component of the stack, for example the chip 204. In one embodiment, the heat profile may be implemented in the tool base 302, or both the tool head 304 and the tool base 302.

Figure 5:
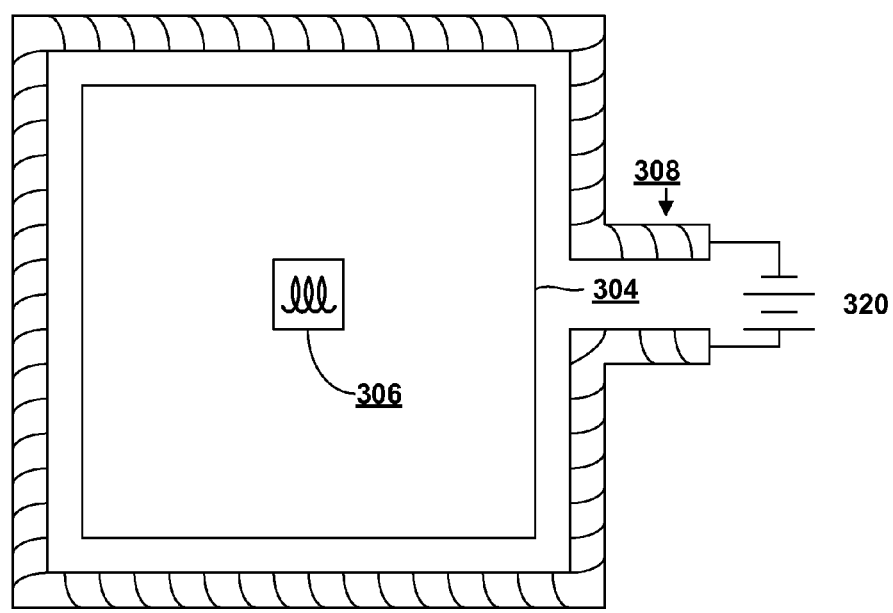
FIG. 5 is a cross section view of FIG. 4 depicting a tool head of the thermal compression tool according to an exemplary embodiment.

Referring now to FIG. 5 a cross section view, along section line A-A of FIG. 4, is shown. In the present embodiment, the tool head 304 may include at least one heat source 306 located in the tool head 304. The heat source 306 may be distributed evenly across the tool head 304, or may be placed in different locations of the tool head 304 based on the geometry of the heating desired. The induction coil 308 may be located separately from the tool head 304, or additionally may be located on the outer edge of the tool head. In either instance, the induction coil should be located such that the inductive heating performed is concentrated on the solder bumps located on the outer portion of the chip 204. The heat source 306 may include an electronic cartage heater or a hot gas supply. In one embodiment, the temperature of the heat source 306 may range from about 27° C. to about 400° C.

Figure 6:
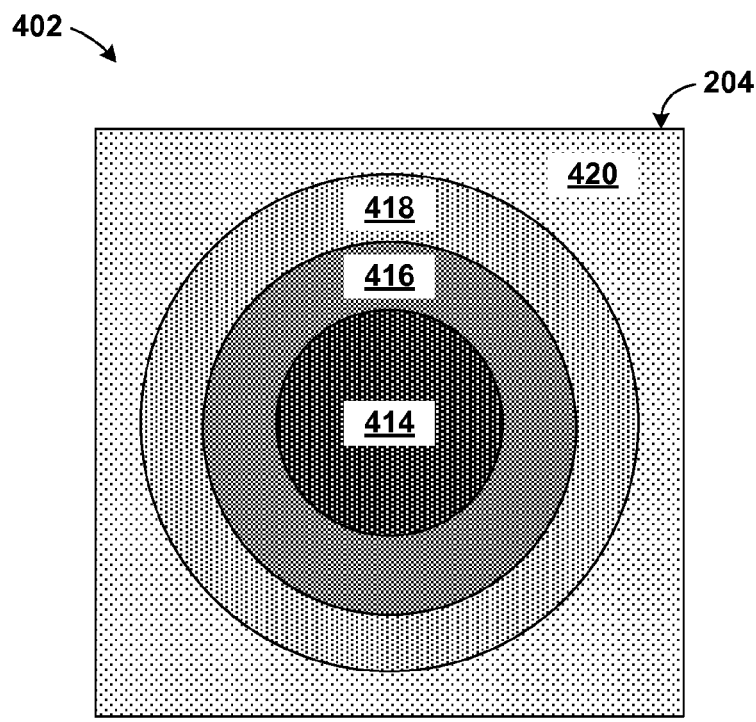
FIG. 6 illustrates a temperature gradients, without inductive heating, of the heated chip during bonding process shown in FIG. 5 according to an exemplary embodiment.
Figure 7:
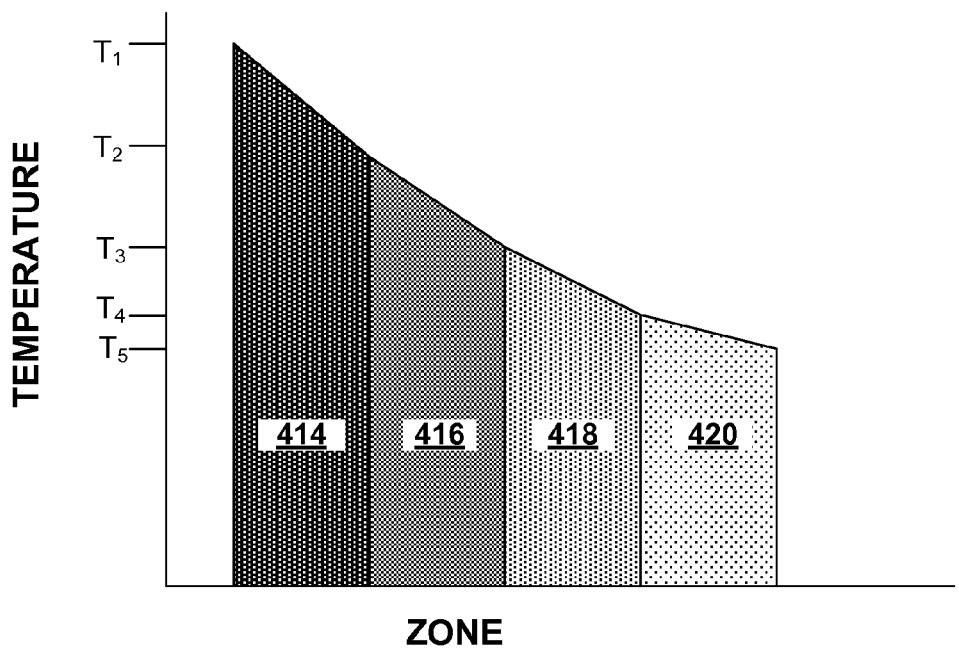
FIG. 7 illustrates a chart depicting temperature versus zone of the heat profiles shown in FIG. 6 according to an exemplary embodiment.
Figure 8:
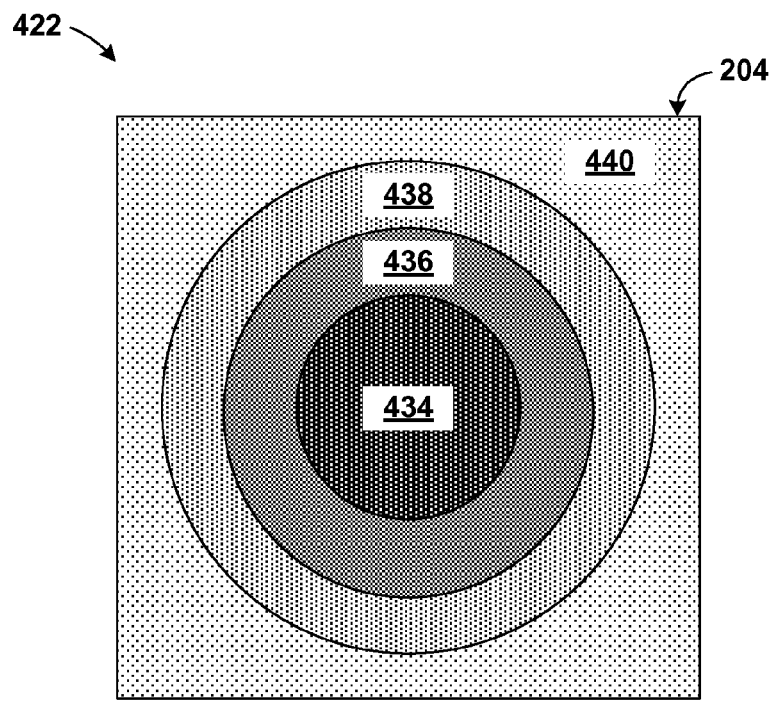
FIG. 8 illustrates a temperature gradients, with inductive heating, of the heated chip during bonding process shown in FIG. 5 according to an exemplary embodiment.
Figure 9:
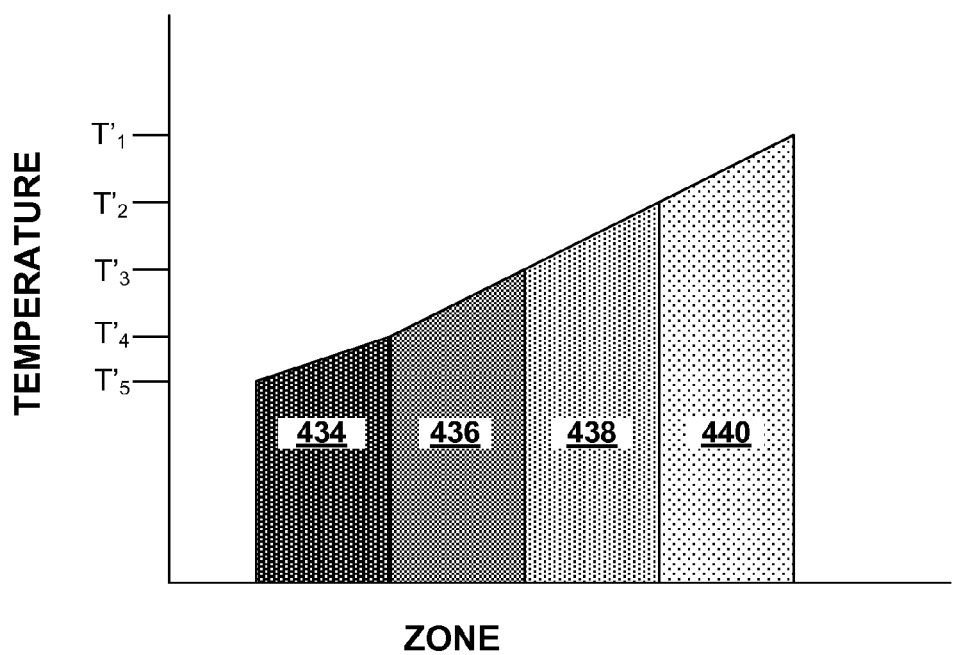
FIG. 9 illustrates a chart depicting temperature versus zone of the heat profiles shown in FIG. 8 according to an exemplary embodiment.

Generally, a uniform heating arrangement is applied to achieve the requisite temperatures to cause the solder bumps to transition from a solid phase to a liquid phase, or reflow, and to form the desired permanent electromechanical connection between the chip carrier 202 and the chip 204. However, heating the chip using only conductive heat that originates from the head may lead to temperature gradients across the chip, due to the geometry and dynamics of the heating. This may account for bridging of solder in the middle of a chip, and inadequate heating at the edges of a chip. FIG. 6 and FIG. 7 show a representative example temperature gradient of the chip 204 during the thermal bonding process, performed only with the heat source 306 in the tool head 304. FIG. 8 and FIG. 9 show a representative example temperature gradient of the chip 204 during the thermal bonding process, performed using the heat source 306 in the tool head 304 and the induction coil 308.

Referring now to FIG. 6, a temperature gradient 402 of the chip 204 during bonding without inductive heating is depicted. FIG. 6 is a representative example of the temperature gradient 402, which may vary based on the placement of the heat source 306. The temperature gradient 402 may be depicted using four temperature zones, a first zone 414, a second zone 416, a third zone 418, and a fourth zone 420. It should be noted, however, that the number of temperature zones depicted and their relative spatial relationship to one another is provided for illustrative purposes only. The relationship between the temperatures of each zone depicted in FIG. 6 is illustrated in the chart depicted in FIG. 7.

In cases where the heat source 306 is distributed relatively uniformly, and the induction coil 308 is not used, the center, or the first zone 414, of the temperature gradient 402 may have a first zone maximum temperature $T_1$ about equal to or less than the set temperature of the heat source 306. It should be noted that when the tool head 304 has uniform temperature just prior to the bonding process, the chip 204 temperature may not be uniform a during bonding, as energy may dissipate unevenly, therefore causing a temperature gradient across the chip during the bonding process. Additionally, each temperature zone may have its own maximum temperature, i.e. first zone temperature $T_1$, second zone temperature $T_2$, third zone temperature $T_3$, and fourth zone temperature $T_4$ and an outer edge temperature $T_5$. Moreover, the first zone 414 may generally have the highest temperature of the temperature gradient 402 in such instances. In this example, the temperature may decrease as the distance from the center increases according to known principles of heat transfer, i.e. $T_1 > T_2 > T_3 > T_4 > T_5$. Thus, the temperature may generally decrease from the first zone 414 to the fourth zone 420. Additionally, various factors, such as for example, tool head materials, or the size or power of the heat source 306 may affect or change the respective heat profile.

Referring now to FIG. 7, a chart 400 corresponding to the temperature gradient 402 of the chip 204 during bonding without inductive heating is depicted. The different shaded columns of the chart 400 correspond to the different zones depicted in FIG. 6. The column on the far left of the chart 400 represents the approximate temperature of the heat source 306 of both FIG. 5, and the highest temperature of all the zones depicted. Additionally, each temperature zone may have their own maximum temperature, i.e. zone 1 414 has a first zone temperature $T_1$, zone 2 416 has a second zone temperature $T_2$, zone 3 418 has a third zone temperature $T_3$, and zone 4 420 has a fourth zone temperature $T_4$ and an outer edge temperature $T_5$. In some instances, this temperature gradient may cause overheating of the solder bumps in zone 1 414, which may contribute to bridging of the solder bumps. This temperature gradient may also cause inadequate heating of the solder bumps in zone 4 420, which may cause for inadequate wetting of the solder bumps.

In order to provide better control on the heating distribution on the chip 204 and solder bumps 206, inductive heating may be provided using the induction coil 308. This may allow for a more uniform bonding, such that the temperature at the center of the chip 204 is within 5° C. of the temperature at the edge of the chip 204, or in some instances to create a temperature gradient where the fourth zone 440 has the highest temperature as shown in FIG. 9. Inductive heating occurs by oscillating a magnetic field to induce a current in conductive materials. This induced current may then heat the conductive materials, such as the tool head 304, the tool base 306 and solder bumps 206. Heating rate and distribution may be manipulated by changing the frequency or magnitude of oscillation of the magnetic field, in order to achieve the desired results. The frequency of oscillation should be large enough to induce current to produce sufficient heat to the solder bumps, while being low enough as to not create a substantial voltage in the semiconductor device, which may damage the semiconductor device. In a preferred embodiment, the frequency of oscillation may be from 1 to 1000 kHz.

Referring now to FIG. 8, a temperature gradient 422 of the chip 204 during bonding with inductive heating is depicted. The temperature gradient 422 may be depicted using four temperature zones, a first zone 434, a second zone 436, a third zone 438, and a fourth zone 440. It should be noted, however, that the number of temperature zones depicted and their relative spatial relationship to one another is provided for illustrative purposes only. The relationship between the temperatures of each zone depicted in FIG. 8 is illustrated in the chart depicted in FIG. 9. Further, the placement of the induction coil 308 on the anterior to the head, or on the outer portion of the head, means that inductive heating would have the greatest effect on the solder bumps located in zone 4 440, with the effect decreasing towards the center of the chip. This may allow for better control of the temperature of zone 4 440, independent from the control of the temperature of zone 1 434.

In cases where the heat source 306 is distributed relatively uniformly, and the induction coil 308 is used, the center, or the first zone 434, of the temperature gradient 422 may have a first zone temperature $T'_5$ about equal the set temperature of the heat source 306. Additionally, each temperature zone boundary may have its own temperature, i.e. first boundary temperature $T'_4$ (located between the first zone 434 and second zone 436), second boundary temperature $T'_3$ (located between the third zone 438 and second zone 436), and third boundary temperature $T'_2$ (located between the third zone 438 and fourth zone 440). Additionally, an outer edge temperature $T'_1$ may represent the temperature on the outer edge of the chip 204. In some embodiments, the induction coil 308 may be operated so that the temperature of the outer edge $T'_1$ is approximately the same as the temperature of the first zone $T'_5$. In such embodiments, this may allow for the temperature of the heating element to be decreased because supplemental heating is occurring due to the induction coils. Thus, the heat introduced by the heat source 306 only needs to be enough to reflow the solder bumps 206 in the center of the chip, and not enough to reflow the solder bumps 206 throughout the chip. This may allow for uniform heating of the solder bumps, which may eliminate bridging that occurs during overheating, and incomplete formation that occurs from underheating. In other embodiments, the induction coil may be operated. In additional embodiments, the outer edge temperature $T'_1$ may be higher than the first zone temperature $T'_5$ in order to more precisely control the reflow of the solder bumps 206.

Referring now to FIG. 9, a chart 430 corresponding to the temperature gradient 422 of the chip 204 during bonding with inductive heating is depicted. In the illustrated example, the outer edge temperature $T'_1$ is greater than the temperature in the first zone $T'_5$. The different shaded columns of the chart 430 correspond to the different zones depicted in FIG. 8. The column on the far left of the chart 430 represents the approximate temperature of the heat source 306. Additionally, each temperature zone may have their own maximum temperature, i.e. zone 1 434 has a first zone temperature $T'_4$, zone 2 436 has a second zone temperature $T'_3$, zone 3 438 has a third zone temperature $T'_2$, and zone 4 440 has a fourth zone temperature $T'_1$. By using inductive heating, the heat profile 430 may occur, where the temperature in zone 4 440 is higher than the temperature in zone 1 434. By using inductive heating, in addition to a heating element, the temperature profile may be inverted.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein. It is therefore intended that the present invention not be limited to the exact forms and details described and illustrated but fall within the scope of the appended claims.

What is claimed is:

1. A method of forming a flip chip assembly comprising joining a chip to a chip carrier with a plurality of solder bumps, wherein joining the chip to the chip carrier comprises heating the plurality of solder bumps to a temperature greater than the reflow temperature of the plurality of solder bumps using conductive heating and inductive heating, wherein conductive heating is performed using a heating element located in a tool head, wherein the tool head is in direct contact with the chip during conductive heating, and wherein inductive heating is performed by an induction coil substantially encircling the tool head.

2. The method of claim 1, wherein the chip has a substantially uniform temperature during heating.

3. The method of claim 1, wherein the chip has a temperature gradient such that an edge of the chip has a higher temperature than a center of the chip.

4. The method of claim 3, wherein inductive heating is controlled such that the temperature on the edge of the chip is higher than the temperature on the center of the chip.

5. The method of claim 1, wherein a material of the chip carrier comprises, silicon, glass, or a composite.

6. A method of forming a flip chip assembly comprising joining a chip layer, comprising at least a first chip and a second chip, to a chip carrier with a plurality of solder bumps, wherein joining the chip layer to the chip carrier comprises heating the plurality of solder bumps to a temperature greater than the reflow temperature of the plurality of solder bumps using conductive heating and inductive heating, wherein conductive heating is performed using a heating element located in a tool head, wherein the tool head is in direct contact with the chip during conductive heating, and wherein inductive heating is performed by an induction coil substantially encircling the tool head.

7. The method of claim 6, wherein the chip layer has a substantially uniform temperature during heating.

8. The method of claim 6, wherein the chip layer has a temperature gradient such that an edge of the chip layer has a higher temperature than a center of the chip layer.

9. The method of claim 8, wherein inductive heating is controlled such that the temperature on the edge of the chip layer is higher than the temperature on the center of the chip layer.

10. The method of claim 6, wherein a material of the chip carrier comprises silicon, glass, or a composite.

11. A flip chip bonding apparatus comprising:
a tool base having a first surface;
a tool head having a second surface, wherein the first surface of the tool base and the second surface of the tool head are facing each other, and the tool head may be moved with respect to the tool base;
a conductive heating element located in the tool head; and
an inductive heating element substantially encircling the tool head.

12. The apparatus of claim 11, wherein the inductive heating element is located on an outer portion of the tool head.

13. The apparatus of claim 11, wherein the inductive heating element is located anterior to the tool head.

14. The apparatus of claim 11, further comprising a temperature monitoring device that receives a temperature on an outer edge of a chip during bonding.

15. The apparatus of claim 14, further comprising a inductive heating controller, wherein the inductive heating controller receives the temperature on the outer edge of the chip during bonding from the temperature monitoring device, and the inductive heating controller modifies the amount of energy emitted from the inductive heating element based on the temperature of the outer edge of the chip during bonding.

16. The apparatus of claim 11, wherein the second surface of the tool head moves substantially perpendicular to the first surface of the tool base.

* * * * *